(12) United States Patent
Madasu et al.

(10) Patent No.: US 9,670,769 B2
(45) Date of Patent: Jun. 6, 2017

(54) COMPUTATIONAL MODEL FOR TRACKING BALL SEALERS IN A WELLBORE

(71) Applicant: Haliburton Energy Services, Inc., Houston, TX (US)

(72) Inventors: Srinath Madasu, Houston, TX (US); Avi Lin, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 135 days.

(21) Appl. No.: 14/427,201

(22) PCT Filed: May 2, 2014

(86) PCT No.: PCT/US2014/036624
§ 371 (c)(1),
(2) Date: Mar. 10, 2015

(87) PCT Pub. No.: WO2015/167584
PCT Pub. Date: Nov. 5, 2015

(65) Prior Publication Data
US 2016/0130933 A1 May 12, 2016

(51) Int. Cl.
*E21B 47/09* (2012.01)
*E21B 33/02* (2006.01)
(Continued)

(52) U.S. Cl.
CPC .............. *E21B 47/09* (2013.01); *E21B 33/02* (2013.01); *E21B 33/13* (2013.01); *E21B 33/138* (2013.01); *G06F 17/10* (2013.01); *G06F 17/5009* (2013.01)

(58) Field of Classification Search
None
See application file for complete search history.

(56) References Cited

U.S. PATENT DOCUMENTS 4,160,482 A * 7/1979 Erbstoesser ........... E21B 33/068
166/284
4,194,561 A 3/1980 Stokley et al.
(Continued)

OTHER PUBLICATIONS

M. Nozaki, "A comprehensive Placement and diversion model for matrix acidizing in vertical in heterogeneous thick formations" pp. 1-92, 2012.*

(Continued)

*Primary Examiner* — Kibrom K Gebresilassie
(74) *Attorney, Agent, or Firm* — Baker Botts L.L.P.

(57) ABSTRACT

In accordance with some embodiments of the present disclosure, a method of computational modeling for tracking ball sealers in a wellbore is disclosed. The method may include, for a time step, calculating a number of ball sealers to inject into a wellbore, injecting the ball sealers, determining a length of the wellbore occupied by a fluid, and computing a spacing between each ball sealer in the length of the wellbore occupied by the fluid. The method may include calculating a first position of a ball sealer, determining a velocity the ball sealer, and computing a second position of the ball sealer. The method may include recording a number of active ball sealers and open perforations in the wellbore, calculating a ball sealer skin per division, and determining a fluid flow rate. The method may include selecting parameters for a stimulation operation in the wellbore based on the fluid flow rate.

20 Claims, 5 Drawing Sheets

(51) Int. Cl.
*E21B 33/13* (2006.01)
*G06F 17/10* (2006.01)
*G06F 17/50* (2006.01)
*E21B 33/138* (2006.01)

(56) References Cited

U.S. PATENT DOCUMENTS

| | | | |
|---|---|---|---|
| 4,505,334 A * | 3/1985 | Doner | E21B 33/138 |
| | | | 156/170 |
| 4,753,295 A | 6/1988 | Gabriel et al. | |
| 6,186,230 B1 | 2/2001 | Nierode | |
| 2002/0007949 A1* | 1/2002 | Tolman | E21B 33/124 |
| | | | 166/308.1 |
| 2009/0101334 A1 | 4/2009 | Baser et al. | |
| 2010/0122813 A1* | 5/2010 | Trummer | E21B 33/138 |
| | | | 166/255.1 |
| 2014/0182841 A1* | 7/2014 | Lecerf | E21B 43/26 |
| | | | 166/250.01 |
| 2014/0318781 A1* | 10/2014 | Kofoed | E21B 33/124 |
| | | | 166/285 |
| 2015/0285029 A1* | 10/2015 | Tolman | E21B 43/12 |
| | | | 166/297 |

OTHER PUBLICATIONS

International Search Report and Written Opinion, Application No. PCT/US2014/036624, 10 pages, Feb. 4, 2015.
De Mas et al.; "Using Computational Fluid Dynamics to Accurately Determine Ball Drop Times and Velocities in Fracturing Systems"; Society of Petroleum Engineers; SPE 163835; pp. 9, Feb. 2013.
International Preliminary Report on Patentability, PCT Application No. PCT/US2014/036624, 6 pages, Nov. 17, 2016.

* cited by examiner

COMPUTATIONAL MODEL FOR TRACKING BALL SEALERS IN A WELLBORE

RELATED APPLICATION

This application is a U.S. National Stage Application of International Application No. PCT/US2014/036624 filed May 2, 2014, the contents of which is hereby incorporated by reference in its entirety.

TECHNICAL FIELD

The present disclosure relates generally to well drilling and hydrocarbon recovery operations and, more particularly, to a computational model for tracking ball sealers in a wellbore.

BACKGROUND

During completion operations in wells, different stimulation techniques may be performed downhole, including nitrogen circulation, acidizing, fracturing, or a combination of acidizing and fracturing. Acidizing and nitrogen circulation are designed to clean up residues and skin damage in the wellbore in order to improve the flow of oil. Fracturing is designed to create fractures in the surrounding formation surrounding the wellbore to allow oil or gas to flow from a reservoir into the well. To enable the use of these stimulation techniques, perforations, or holes, may be created in a downhole casing in the wellbore. The perforations allow acid and other fluids to flow from the wellbore into the surrounding formation. The perforations may also allow oil to flow into the wellbore from fractures in the formation created during fracturing techniques.

Other stimulation operations may include using a sliding sleeve separation tool. A sliding sleeve may have gaps in the sleeve at two or more locations to allow for pumping oil from multiple reservoirs in a single wellbore without mixing the production from each reservoir.

During stimulation or completion operations, ball sealers may be injected into the wellbore to seal perforations that are capable of passing fluid from the wellbore into the formation. When a perforation is sealed by a ball sealer, injected fluid may be diverted to other areas of the wellbore. The use of ball sealers as a diversion method enables the fluid to flow deeper into the wellbore. Ball sealers may also be used in a sliding sleeve operation to seat in one or more gaps in the sleeve.

BRIEF DESCRIPTION OF THE DRAWINGS

For a more complete understanding of the present disclosure and its features and advantages, reference is now made to the following description, taken in conjunction with the accompanying drawings, in which.

DETAILED DESCRIPTION

A computational model for tracking ball sealers in a wellbore and related systems and methods are disclosed. In broad terms, one aspect of the disclosed models takes into consideration the positioning and seating of a ball sealer in a perforation of a casing in a wellbore based on the forces acting on the ball sealer. These forces may include drag forces, gravitational forces, and forces due to the effects of the perforations. By considering these forces, the disclosed models are able to more accurately analyze and/or predict the location and velocity of a ball sealer as the ball sealer travels through a wellbore. The disclosed models may determine the surface area of the ball sealer which is exposed to the fluid flow for use in calculating a fluid flow rate. The fluid flow rate may be used to model the conditions in the wellbore and provide data for designing a stimulation or completion operation. For example, for fracturing operations, the pressure at which the fluid exits a perforation (which may be referred to as the "exit pressure" of the fluid) may be an important parameter for designing an effective stimulation operation. The fluid flow rate may be used to calculate the exit pressure of the fluid. The pressure of the fluid and the fluid flow rate may be used to calculate the temperature of the fluid. Additionally, the conditions in the wellbore may be used in real-time during stimulation operations in order to monitor the conditions downhole to evaluate whether the stimulation operation is proceeding as designed. Accordingly, a system and model may be designed in accordance with the teachings of the present disclosure and may have different designs, configurations, and/or parameters according to a particular application. Embodiments of the present disclosure and its advantages are best understood by referring to FIGS. 1 through 5, where like numbers are used to indicate like and corresponding parts.

Figure 1:
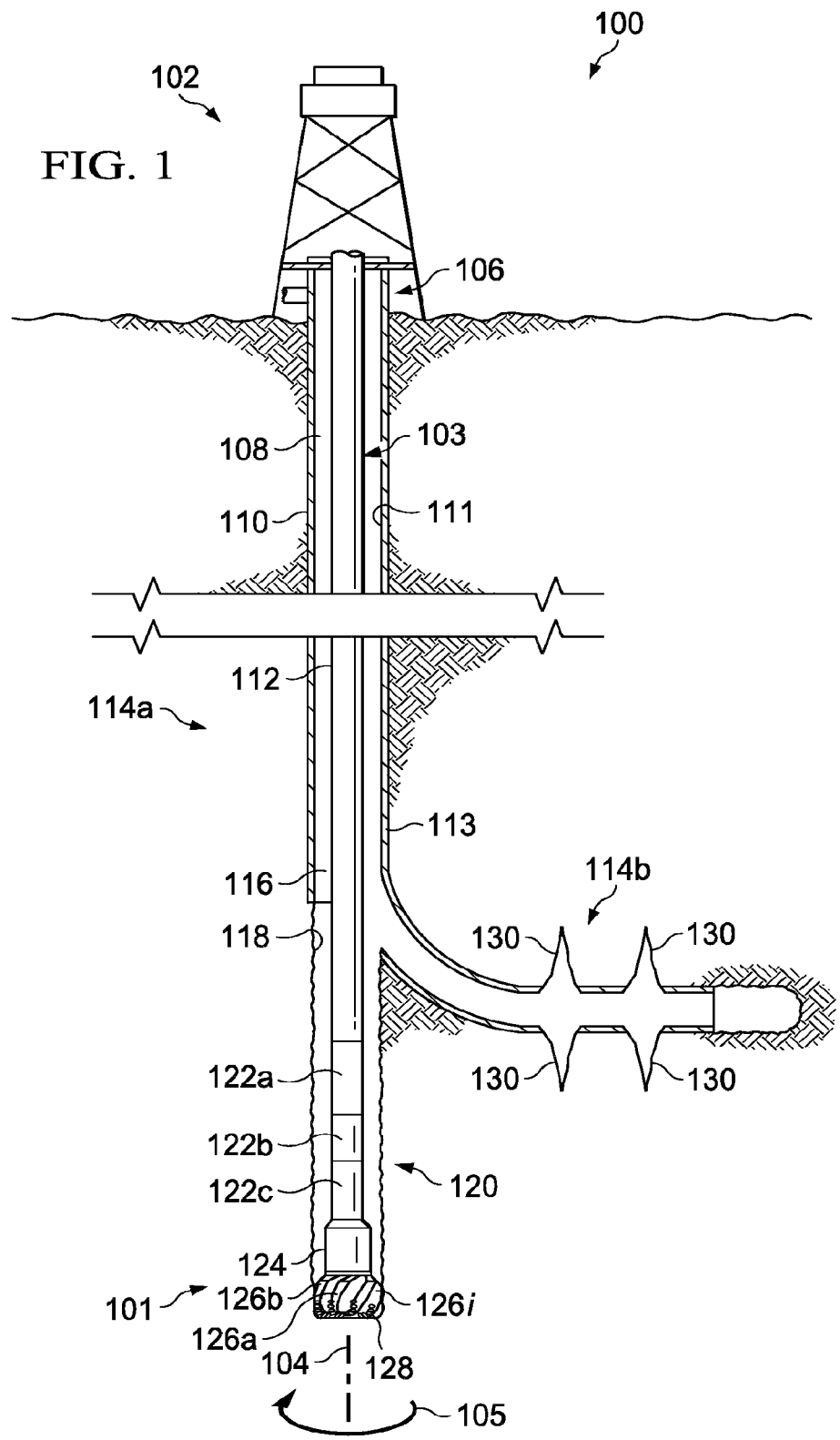
FIG. 1 illustrates an elevation view of an example embodiment of a drilling system, in accordance with some embodiments of the present disclosure.

FIG. 1 illustrates an elevation view of an example embodiment of drilling system 100, in accordance with some embodiments of the present disclosure. Drilling system 100 may include well surface or well site 106. Various types of drilling equipment such as a rotary table, drilling fluid pumps and drilling fluid tanks (not expressly shown) may be located at well surface or well site 106. For example, well site 106 may include drilling rig 102 that may have various characteristics and features associated with a "land drilling rig." However, downhole drilling tools incorporating teachings of the present disclosure may be satisfactorily used with drilling equipment located on offshore platforms, drill ships, semi-submersibles and drilling barges (not expressly shown).

Drilling system 100 may also include drill string 103 associated with drill bit 101 that may be used to form a wide variety of wellbores or bore holes such as generally vertical wellbore 114a or generally horizontal 114b wellbore or any combination thereof. Various directional drilling techniques and associated components of bottom hole assembly (BHA) 120 of drill string 103 may be used to form horizontal wellbore 114b. For example, lateral forces may be applied to BHA 120 proximate kickoff location 113 to form generally horizontal wellbore 114b extending from generally vertical wellbore 114a. The term "directional drilling" may be used to describe drilling a wellbore or portions of a wellbore that extend at a desired angle or angles relative to vertical. The desired angles may be greater than normal variations associated with vertical wellbores. Direction drilling may also be described as drilling a wellbore deviated from vertical. The term "horizontal drilling" may be used to include drilling in a direction approximately ninety degrees (90°) from vertical. "Uphole" may be used to refer to a portion of wellbore 114 that is closer to well surface 106. "Downhole" may be used to refer to a portion of wellbore 114 that is further from well surface 106.

BHA 120 may be formed from a wide variety of components configured to form wellbore 114. For example, components 122a, 122b, and 122c of BHA 120 may include, but are not limited to, drill bits (e.g., drill bit 101), coring bits, drill collars, rotary steering tools, directional drilling tools, downhole drilling motors, reamers, hole enlargers or stabilizers. The number and types of components 122 included in BHA 120 may depend on anticipated downhole drilling conditions and the type of wellbore that will be formed by drill string 103 and rotary drill bit 101. BHA 120 may also include various types of well logging tools (not expressly shown) and other downhole tools associated with directional drilling of a wellbore. Examples of logging tools and/or directional drilling tools may include, but are not limited to, acoustic, neutron, gamma ray, density, photoelectric, nuclear magnetic resonance, rotary steering tools and/or any other commercially available well tool. Further, BHA 120 may also include a rotary drive (not expressly shown) connected to components 122a, 122b, and 122c and which rotates at least part of drill string 103 together with components 122a, 122b, and 122c.

Wellbore 114 may be defined in part by casing string 110 that may extend from well surface 106 to a selected downhole location. Portions of wellbore 114, as shown in FIG. 1, that do not include casing string 110 may be described as "open hole." Various types of drilling fluid may be pumped from well surface 106 through drill string 103 to attached drill bit 101. The drilling fluids may be directed to flow from drill string 103 to respective nozzles passing through rotary drill bit 101. The drilling fluid may be circulated back to well surface 106 through annulus 108 defined in part by outside diameter 112 of drill string 103 and inside diameter 118 of wellbore 114. Inside diameter 118 may be referred to as the "sidewall" of wellbore 114. Annulus 108 may also be defined by outside diameter 112 of drill string 103 and inside diameter 111 of casing string 110. Open hole annulus 116 may be defined as sidewall 118 and outside diameter 112.

Drilling system 100 may also include rotary drill bit ("drill bit") 101. Drill bit 101 may include one or more blades 126 that may be disposed outwardly from exterior portions of rotary bit body 124 of drill bit 101. Blades 126 may be any suitable type of projections extending outwardly from rotary bit body 124. Drill bit 101 may rotate with respect to bit rotational axis 104 in a direction defined by directional arrow 105. Blades 126 may include one or more cutting elements 128 disposed outwardly from exterior portions of each blade 126. Blades 126 may also include one or more depth of cut controllers (not expressly shown) configured to control the depth of cut of cutting elements 128. Blades 126 may further include one or more gage pads (not expressly shown) disposed on blades 126. Drill bit 101 may be designed and formed in accordance with teachings of the present disclosure and may have many different designs, configurations, and/or dimensions according to the particular application of drill bit 101.

BHA 120 may also include a stimulation assembly (not expressly shown). The stimulation assembly may be configured to create perforations 130 in casing string 110. Perforations 130 may allow for stimulation operations, such as fracturing, acidizing, matrix acidizing, or any other suitable stimulation operation to be performed in wellbore 114. During stimulation operations, fluid may be injected into wellbore 114. The fluid may travel through wellbore 114 and may exit wellbore 114 at perforations 130. However, the fluid may not be distributed uniformly among the perforations. Ball sealers may be injected into wellbore 114 along with the fluid to provide a mechanical mechanism for diverting fluid flow. A ball sealer may seat in perforation 130 to block the fluid from exiting wellbore 114 at perforation 130. Therefore, the ball sealers may serve to divert the flow of the fluid further downhole into wellbore 114.

Figure 2:
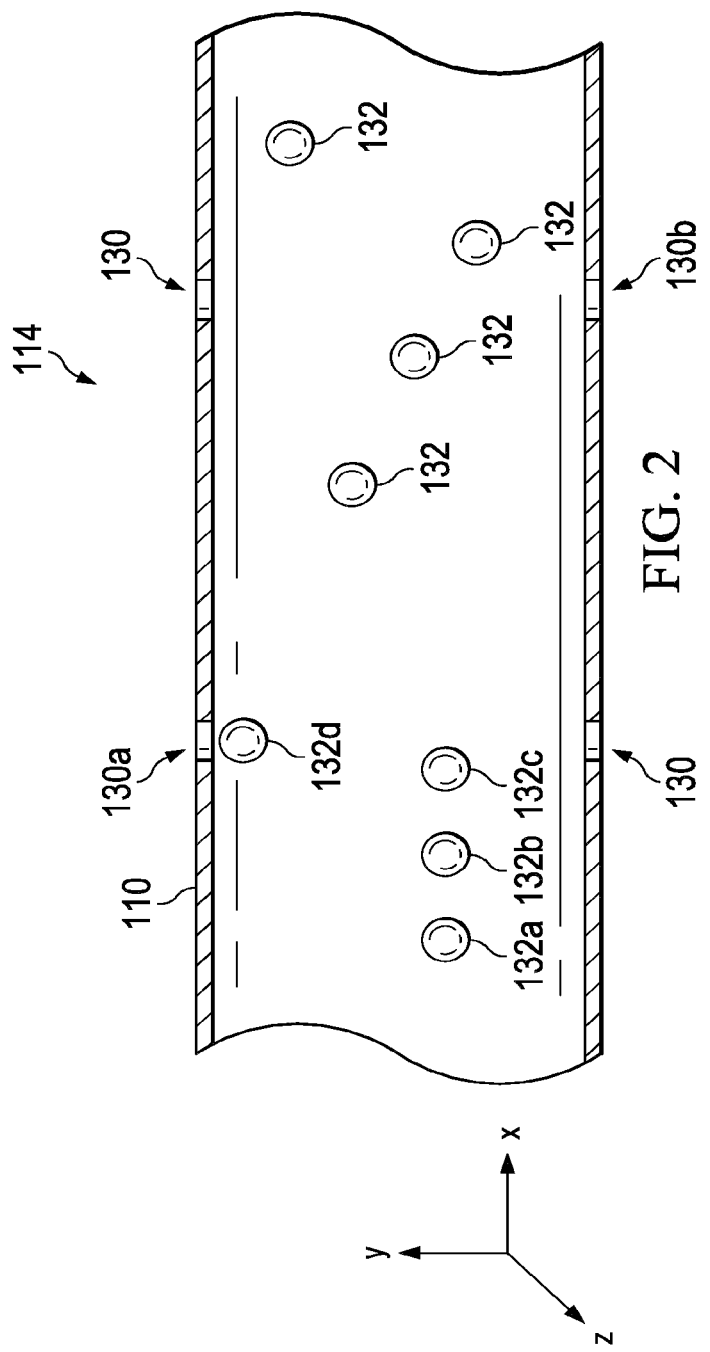
FIG. 2 illustrates an elevation view of an example embodiment of a perforated wellbore, in accordance with some embodiments of the present disclosure.
Figure 3:
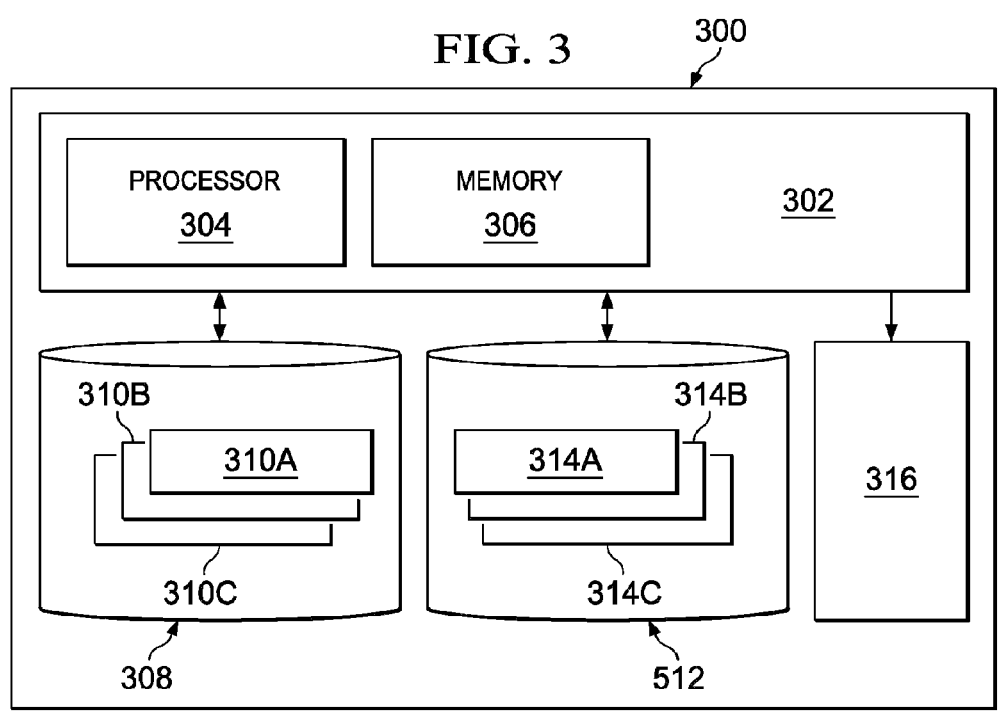
FIG. 3 illustrates a block diagram of an exemplary wellbore modeling system, in accordance with some embodiments of the present disclosure.
Figure 4:
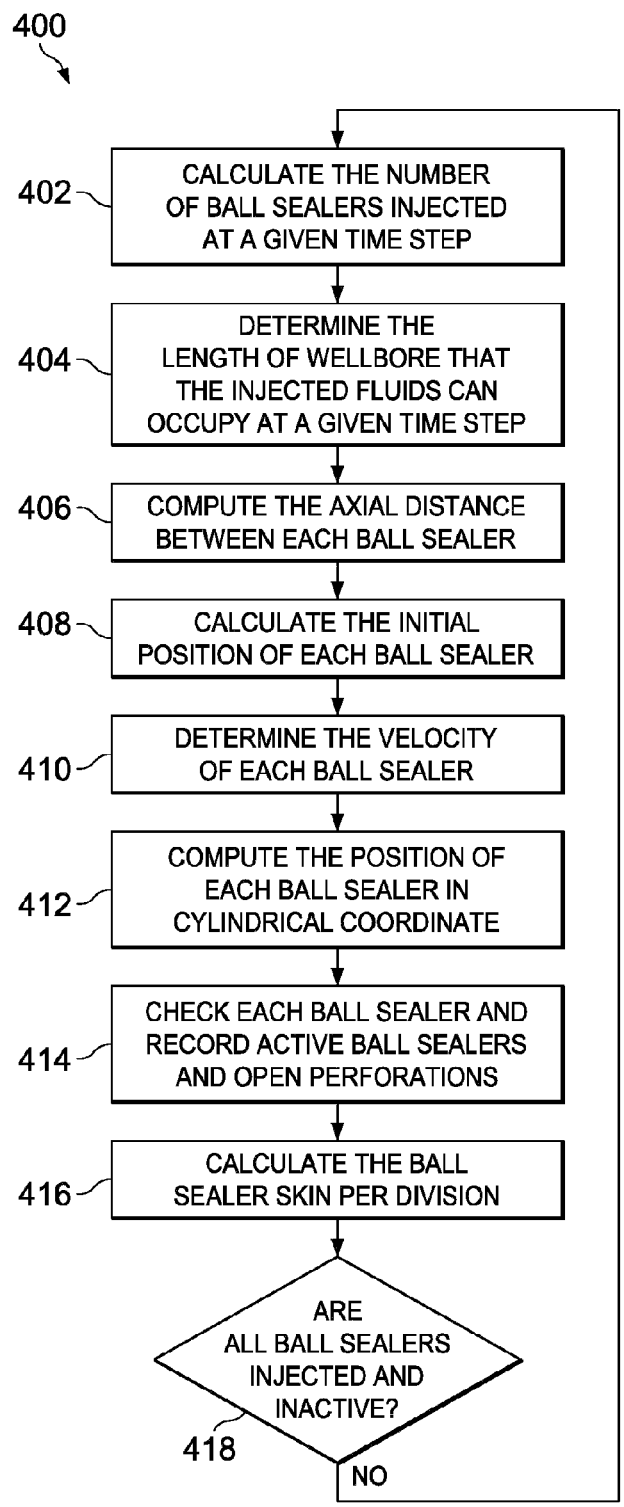
FIG. 4 illustrates a flow chart of a method for a computational model for tracking ball sealers in a wellbore, in accordance with some embodiments of the present disclosure.

In some embodiments of the disclosure, it may be advantageous to model the location of ball sealers as they travel through wellbore 114, as disclosed in further detail with respect to FIGS. 2 through 4. For example, during injection of fluid into wellbore 114, the model may predict the number of balls seated in perforations 130 and may provide engineers and operators of drilling system 100 with an accurate representation of the conditions in wellbore 114. The model may predict the interaction between the ball sealers and the fluid and may provide an accurate representation of the number of balls injected and/or seated throughout the pumping schedule of the fluid. The model may allow for calculating the fluid flow rate after some or all perforations 130 have been blocked by a ball sealer. The fluid flow rate may be important for a stimulation operation. For example, the flow rate of a fluid may impact whether a fracturing operation is successful. As another example, the flow rate of an acid fluid may affect whether an acidizing operation adequately cleans the wellbore. As such, a wellbore modeling system designed according to the present disclosure may improve accuracy of predictions of the distribution of fluid during a downhole operation.

FIG. 2 illustrates an elevation view of an example embodiment of a perforated wellbore, in accordance with some embodiments of the present disclosure. A coordinate system is provided in FIG. 2 in order to provide a reference or defining the location of a ball sealer at any point in a three-dimensional space of the wellbore. In the illustrated embodiment, the x-axis is aligned with the direction of fluid flow in the wellbore. The y-axis is aligned perpendicular to, and in the same plane as, the x-axis and the z-axis is perpendicular to both the x-axis and y-axis. While wellbore 114 is shown in FIG. 2 as a horizontal wellbore, the wellbore modeling system disclosed may be used in horizontal, vertical, or directional wellbores.

When fluid (not expressly shown) and ball sealers 132 are injected into wellbore 114, ball sealers 132 may be distributed along wellbore 114 equidistantly along the x-axis, also referred to as the direction of fluid flow, and randomly along the y and z axes, as shown by ball sealers 132a-132c. Once ball sealers 132 reach perforation 130, a single ball sealer 132 may seat in the perforation 130. For example, ball sealer 132d is shown as seated in perforation 130a. Once ball sealer 132d is seated in perforation 130a, fluid may no longer exit wellbore 114 at perforation 130a. Therefore fluid and remaining ball sealers 132 may be diverted to other perforations 130 further downhole in wellbore 114.

FIG. 3 illustrates a block diagram of an exemplary wellbore modeling system 300, in accordance with some embodiments of the present disclosure. Wellbore modeling system 300 may be configured to perform computational modeling for tracking ball sealers in a wellbore. For example, wellbore modeling system 300 may be used to perform the steps of method 400 as described with respect to FIG. 4. In some embodiments, wellbore modeling system 300 may include wellbore modeling module 302. Wellbore modeling module 302 may include any suitable components. For example, in some embodiments, wellbore modeling module 302 may include processor 304. Processor 304 may include, for example a microprocessor, microcontroller, digital signal processor (DSP), application specific integrated circuit (ASIC), or any other digital or analog circuitry configured to interpret and/or execute program instructions and/or process data. In some embodiments, processor 304 may be communicatively coupled to memory 306. Processor 304 may be configured to interpret and/or execute program instructions and/or data stored in memory 306. Program instructions or data may constitute portions of software for carrying out computational modeling for tracking ball sealers in a wellbore, as described herein. Memory 306 may include any system, device, or apparatus configured to hold and/or house one or more memory modules; for example, memory 306 may include read-only memory, random access memory, solid state memory, or disk-based memory. Each memory module may include any system, device or apparatus configured to retain program instructions and/or data for a period of time (e.g., computer-readable non-transitory media).

Wellbore modeling system 300 may further include fluid property database 308. Fluid property database 308 may be communicatively coupled to wellbore modeling module 302 and may provide fluid property parameters 310a-310c in response to a query or call by wellbore modeling module 302. Fluid property parameters 310a-310c may be implemented in any suitable manner, such as by parameters, functions, definitions, instructions, logic, or code, and may be stored in, for example, a database, file, application programming interface, library, shared library, record, data structure, service, software-as-service, or any other suitable mechanism. Fluid property parameters 310a-310c may specify any suitable properties or parameters for a fluid that may be injected into a wellbore, such as, for example, the density of the fluid, the viscosity of the fluid, and/or the permeability of the fluid. Although fluid property database 308 is illustrated as including three fluid property parameters, fluid property database 308 may contain any suitable number of fluid property parameters.

Wellbore modeling system 300 may further include ball scaler property database 312. Ball sealer property database 312 may be communicatively coupled to wellbore modeling module 302 and may provide ball sealer property parameters 314a-314c in response to a query or call by wellbore modeling module 302. Ball sealer property parameters 314a-314c may be implemented in any suitable manner, such as by parameters, functions, definitions, instructions, logic, or code, and may be stored in, for example, a database, file, application programming interface, library, shared library, record, data structure, service, software-as-service, or any other suitable mechanism. Ball sealer property parameters 314a-314c may specify any suitable properties or parameters of ball sealers that may be injected into a wellbore, such as ball sealer density, ball sealer diameter, and/or the number of balls pumped into a wellbore at each stage of the stimulation operation. Although ball sealer property database 312 is illustrated as including two instances of ball sealer property parameters, ball scaler property database 312 may contain any suitable number of instances of ball sealer property parameters.

In some embodiments, wellbore modeling module 302 may be configured to perform computational modeling for tracking ball sealers in a wellbore. For example, wellbore modeling module 302 may be configured to import one or more instances of fluid property parameters 310a-310c, and/or one or more instances of ball sealer property parameters 314a-314c. Fluid property parameters 310a-310c, and/or ball sealer property parameters 314a-314c may be stored in memory 306. Wellbore modeling module 302 may be further configured to cause processor 304 to execute program instructions operable to perform computational modeling for tracking ball sealers in a wellbore. For example, processor 304 may, based on fluid property parameters 310a-310c and ball sealer property parameters 314a-314c, generate a model of the locations of one or more ball sealers as the ball sealers travel through a wellbore during a pumping schedule of a stimulation or completion operation and seat in a perforation. The pumping schedule may define the quantity of fluid or a flow rate of fluid that is to be pumped into a wellbore as a function of time.

Wellbore modeling module 302 may be communicatively coupled to one or more displays 316 such that information processed by wellbore modeling module 302 (e.g., position of a ball sealer) may be conveyed to operators of drilling equipment.

Modifications, additions, or omissions may be made to FIG. 3 without departing from the scope of the present disclosure. For example, FIG. 3 shows a particular configuration of components of wellbore modeling system 300. However, any suitable configurations of components may be used. For example, components of wellbore modeling system 300 may be implemented either as physical or logical components. Furthermore, in some embodiments, functionality associated with components of wellbore modeling system 300 may be implemented in special purpose circuits or components. In other embodiments, functionality associated with components of wellbore modeling system 300 may be implemented in configurable general purpose circuit or components. For example, components of wellbore modeling system 300 may be implemented by configure computer program instructions.

The position of ball sealers during travel through a wellbore during a pumping schedule of a downhole drilling operation, such as a stimulation operation, may be calculated by modeling the effect of various forces on ball sealers. FIG. 4 illustrates a flow chart of a method 400 for generating a computational model for tracking ball sealers in a wellbore, in accordance with some embodiments of the present disclosure. The steps of method 400 may be performed by various computer programs, models or any combination thereof, configured to simulate and design drilling systems, apparatuses and devices, such as the wellbore modeling system illustrated in FIG. 3. For illustrative purposes, method 400 is described with respect to the wellbore, the perforations, and the ball sealers illustrated in the previous FIGURES; however, method 400 may be used to track ball sealers in any portion of a wellbore.

Method 400 may begin at step 402. At step 402, the wellbore modeling system may calculate the number of ball sealers injected into a wellbore at a given time step. The number of ball sealers injected at a given time step may be calculated by:

$$\Delta n = \text{int}\left(\Delta t \dot{Q} \frac{N}{V}\right) \tag{1}$$

where

Δn=number of ball sealers injected at the time step;

Δt=time step;

$\dot{Q}$=flow rate of the fluid injected in the time step;

N=total number of ball sealers already injected into the wellbore; and

V=total volume of all ball sealers already injected into the wellbore.

The number of ball sealers injected at a given time step may be proportional to the volume of fluid injected at the given time step. The wellbore modeling system may define the volume of fluid injected at the given time step based on a pumping schedule. The ball sealers may be uniformly distributed over the entire volume of fluid injected into the wellbore or may be uniformly distributed over the pumping schedule such that the total number of ball sealers injected may be conserved. Therefore, if the number of ball sealers injected at the time step is calculated to include a fraction of a ball sealer, the wellbore modeling system may store the fractional value and add the fractional value to the number of ball sealers injected at the next time step. For example, if the wellbore modeling system calculates the number of ball sealers injected at the given time step as 5.5 ball sealers, the wellbore modeling system may determine that five ball sealers are injected at the given time step. The wellbore modeling system may also store the remaining 0.5 ball sealers and add the remaining 0.5 ball sealers to the number of ball sealers injected at the next time step.

At step 404, the wellbore modeling system may determine the length of the wellbore that the injected fluid may occupy at a given time step. The fluid may be a drilling fluid, a fracturing fluid, an acidizing fluid, or any other fluid suitable for use in a wellbore during stimulation operations. The length of the wellbore occupied by the injected fluid at the given time step may be determined by:

$$\Delta L = \frac{i \Delta t \dot{Q}}{\pi r_c^2} \qquad (2)$$

where

ΔL=length of wellbore occupied by the injected fluids within the time step;

i=1, ... Δn; and $r_c$=radius of the casing string.

At step 406, the wellbore modeling system may determine the axial distance between each ball sealer. The axial distance between each ball sealer may be the spacing between each ball sealer along the length of the wellbore, for example along the x-axis, as shown in FIG. 2. The axial distance between each ball sealer may be a subset of the length of the wellbore occupied by the injected fluid within the time step as calculated in step 404. The axial distance between each ball sealer, Δl, may be calculated by:

$$\Delta l = \frac{\Delta L}{\Delta n} \qquad (3)$$

At step 408, the wellbore modeling system may calculate the initial position of each ball sealer. The initial position of a ball sealer may be the inlet of the wellbore at the time the ball sealer is injected into the wellbore. For a ball sealer already injected in the wellbore, the initial position may be the previously calculated position for the ball sealer. The initial position of each ball sealer may be defined with reference to a three-axis coordinate system as shown in FIG. 2. For example, for the three-axis coordinate system shown in FIG. 2, the initial position of each ball sealer may be calculated by:

$$x[i]=(i-0.5)\times \Delta l \qquad (4)$$

where x[i]=the initial position of each ball sealer on the x-axis. Ball sealers may be uniformly distributed along the x-axis.

$$y[i]=r[i]\times \sin \alpha[i] \qquad (5)$$

$$z[i]=r[i]\times \cos \alpha[i] \qquad (6)$$

where $$r[i]=\text{random}\times(r_c-0.5d); \qquad (7)$$

$$\alpha[i]=\text{random}\times 2.0\pi; \text{ and} \qquad (8)$$

d=diameter of the ball sealer.

r[i] represents a random position of a ball sealer where random is a randomly selected value between zero and one. The wellbore modeling system may select the value of random to use in Equations 7 and 8. The ball orientation may be randomized through the use of α[i]. The use of the randomization factor may randomly distribute the balls in the y and z axes along the wellbore occupied by the injected fluids within the time step.

At step 410, the wellbore modeling system may determine the velocity of each ball sealer as it travels through the wellbore. The velocity of each ball sealer may be impacted by drag forces, gravitational forces, and forces due to fluid loss at the perforations. To model the effects of each of the forces on the velocity of a ball sealer, the velocity calculation may include three components: a velocity component due to fluid transport effects, a velocity component due to buoyancy, and a velocity component due to attraction of the perforations. The total velocity may be calculated by:

$$v_x = v_{f,x} + v_{g,x} + v_{p,x} \qquad (9)$$

where $v_{f,x}$=velocity component due to fluid transport effects;

$v_{g,x}$=velocity component due to buoyancy effects; and $v_{p,x}$=velocity component due to attraction of the perforations.

The velocity component due to fluid transport effects, representing the effects of the drag force, may be calculated as:

$$v_{f,x} = \frac{\dot{Q}}{\pi r_c^2} \qquad (10)$$

The velocity component due to buoyancy effects, representing the effects of the gravitational force, may be calculated by:

$$v_{g,x} = 0.5\text{sgn}(\rho - \rho_f) \begin{cases} \sqrt{\dfrac{a}{0.44}} & (Re > 1000) \\ \left(\dfrac{a}{18.5 \times \left(\dfrac{\mu}{d\rho_f}\right)^{0.6}}\right)^{\tfrac{5}{7}} & (Re \leq 1000) \end{cases} \quad (11)$$

where $$a = 1.333\, dg\frac{(\rho - \rho_f)}{\rho_f}; \quad (12)$$

ρ=density of the ball scaler;
$\rho_f$=density of the fluid;
g=gravitational constant; and
μ=viscosity of the fluid.

In Equations 11 and 12, a is a constant. The example equation shown in Equation 11 is based on Stokes' Law for Newtonian flow. Stokes' law may be used to calculate the drag force exerted on spherical objects in a continuous viscous fluid. The velocity component due to buoyancy effects may also be calculated for non-Newtonian fluids. For example, for a power law type fluid, the velocity component due to buoyancy effects may be calculated by:

$$v_{g,x} = \left[\frac{g(\rho - \rho_f)d^{n+1}}{18K}\right]^{1/n} \quad (13)$$

where
K=flow consistency index; and
n=flow behavior index.

As another example, for a Carreau type fluid, the velocity component due to buoyancy effects may be calculated by:

$$v_{g,x} = \frac{g(\rho - \rho_f)d^2}{18\left[\mu_\infty + (\mu_0 - \mu_\infty)\left[1 + \left(\dfrac{\gamma}{\gamma_L}\right)^2\right]^{\tfrac{n-1}{2}}\right]} \quad (14)$$

where
$\mu_0$=viscosity of the fluid at zero shear rate;
$\mu_\infty$=viscosity of the fluid at infinite shear rate;
γ=shear rate of the fluid; and
$\gamma_L$=shear rate of the fluid along the length of the wellbore.

The velocity components may be calculated as a component along each axis. In the example equations shown in Equations 9-11, the velocity equations are shown for the x-axis component. The same equations may be used to calculate the velocity in the y-axis and the z-axis.

The velocity component due to attraction of the perforations, representing the effects of the forces due to fluid loss at the perforations, for each axis, may be calculated by:

$$v_{p,x} = \sum_{j=1}^{M} \frac{a\Delta x}{2\pi} \quad (15)$$

$$v_{p,y} = \sum_{j=1}^{M} \frac{a\Delta y}{2\pi} \quad (16)$$

$$v_{p,z} = \sum_{j=1}^{M} \frac{a\Delta z}{2\pi} \quad (17)$$

where
$v_{p,x}$=x-axis component of the velocity component due to attraction of the perforations;
$v_{p,y}$=y-axis component of the velocity component due to attraction of the perforations;
$v_{p,z}$=z-axis component of the velocity component due to attraction of the perforations;

$$a = 0.5\left(\frac{q_p}{(\Delta x^2 + \Delta y^2 + \Delta z^2)^2}\right); \quad (18)$$

$$\Delta x = x_p[j] - x_b[i]; \quad (19)$$

$$\Delta y = y_p[j] - y_b[i]; \quad (20)$$

$$\Delta z = z_p[j] - z_b[i]; \quad (21)$$

$$q_p = \frac{dq}{dx} \times \frac{dx}{N_{p,div}}\bigg|_j; \quad (22)$$

$N_{p,div}$=number of perforations per division;
i=1, . . . , Δn+$n_o$; and
j=1, . . . , M.

In Equation 22, the term "division" represents the length of the wellbore occupied by the fluid at the given time step. In Equations 15-17, M represents the number of perforations acting on a given ball sealer. In Equation 22, $q_p$ represents the flow rate per unit length in the division where the specific open perforation belongs.

In step 412, the wellbore modeling system may determine the position of each ball sealer in the coordinate system illustrated in FIG. 2. The position calculated in step 412 may take into account the initial position for each ball sealer and the velocity of the ball scaler. The position of each ball scaler may be calculated by:

$$x[i] = x_{old}[i] + dx[i] \quad (23)$$

$$y[i] = y_{old}[i] + dy[i] \quad (24)$$

$$z[i] = z_{old}[i] + dz[i] \quad (25)$$

where $$dx[i] = (v_{f,x} + v_{g,x}\cos\theta + v_{p,x}) \times \Delta t; \quad (26)$$

$$dy[i] = v_{p,y} \times \Delta t; \quad (27)$$

$$dz[i] = (v_{g,x}\sin\theta + v_{p,x}) \times \Delta t; \quad (28)$$

θ=wellbore deviation angle with respect to the vertical axis; and i=1, . . . , Δn+$n_o$.

At the beginning of an analysis, $x_{old}$, $y_{old}$, and $z_{old}$ may be equal to zero. As the analysis continues, $x_{old}$, $y_{old}$, and $z_{old}$ may be equal to the previously calculated value of x[i], y[i], and z[i].

At step 414, the wellbore modeling system may check each ball sealer and record the number of active ball sealers and the number of open perforations. A ball sealer may be active if the ball sealer is still traveling through the wellbore. Alternatively, a ball sealer may be determined to be inactive if the ball sealer is seated in a perforation. A perforation may be open if a ball sealer has not seated in the perforation and blocked fluid from exiting the wellbore at the perforation. Alternatively, a perforation may be determined to be closed if a ball sealer is seated in the perforation. The wellbore modeling system may check each ball sealer by:

If $x[i]>x_p[last]$, then the ball sealer is inactive. (29)

If $x[i]<x_p[last]$ and (30)

$$(x[i]-x_p[j])^2+(y[i]-y_p[j])^2+(z[i]-z_p[j])^2<0.8d^2,$$

then perforation j is closed and the ball sealer is inactive. where $x_p[last]$=location of the most downstream perforation;
$x_p$=location of the perforation along the x-axis;
$y_p$=location of the perforation along the y-axis; and
$z_p$=location of the perforation along the z-axis.

In Equations 27 and 28, last represents the perforation that is located the furthest downhole. The furthest downhole perforation may be open or closed. Equations 27 and 28 may be performed for each ball sealer, $i=1, \ldots, \Delta n+n_o$. If a ball sealer is determined to be inactive in Equation 29, it may have left the relevant portion of the wellbore because the position of the ball sealer is downhole of the most downhole perforation. The relevant portion of the wellbore may be the perforated portion of the wellbore. The relevant portion of the wellbore may include some or all portions of the wellbore uphole of the perforations.

At step 416, the wellbore modeling system may calculate the ball sealer skin per division. The ball sealer skin per division represents the amount of surface area of the ball sealer that may be exposed to the fluid when the ball sealer is seated in a perforation. As ball sealers are seated in perforations, the exposed surface area of the seated ball sealers may increase the surface area of the casing string. The increased surface area of the casing string may reduce the fluid flow rate. The ball sealer skin per division, s, may be calculated by:

$$s = \begin{cases} s_b, & \text{if } 0 < N_{open,perf} < p_{,div} \text{ (perforations partially blocked)} \\ 0, & \text{if } N_{open,perf} = N_{p,div} \text{(no perforations blocked)} \\ 10^4, & \text{if } N_{open,perf} = 0 \text{(all performations blocked)} \\ 10^6 & \text{(dummy layer)} \end{cases}$$ (31)

where $$s_b = -\left(\frac{1}{kv \cdot kh}\right)^{0.5} \times \ln(2 \times p_d \times r_c \times (1 + kv \cdot kh)^{0.5}) \times \frac{1}{l_{perf,effective}} \times \left(\frac{1}{p_d} - \frac{1}{p_{d0}}\right);$$ (32)

$$p_d = \frac{N_{open,perf}}{\Delta x_{div}};$$ (33)

$$p_{d0} = \frac{N_{perf}}{\Delta x_{div}};$$ (34)

$N_{perf}$=total number of perforations in the wellbore;
$N_{open,perf}$=number of open perforations;
$\Delta x_{div}$=length of the division along the x-axis;
kv=vertical component of a permeability constant;
kh=horizontal component of a permeability constant;
$l_{perf,effective}$=effective length of the perforations;
$p_d$=perforation density; and
$p_{d0}$=initial perforation density.

The value of the ball sealer skin per division may be used to calculate the fluid flow rate through the wellbore. When all perforations are blocked or when the fluid is in the dummy layer, a large value for ball sealer skin per division may cause the fluid flow rate to substantially decrease. When the fluid flow rate is substantially decreased, the stimulation operations may cease because no fluid is exiting the wellbore at the perforations. The dummy layer refers to a layer in between two oil reservoirs where no perforations may exist.

At step 418, the wellbore modeling system may determine if all ball sealers have been injected and are inactive. If all ball sealers have been injected and are inactive, method 400 may be complete as no ball sealers remain active for tracking. If all ball sealers have not been injected or if any ball sealers are still active, method 400 may return to step 402 to calculate the number of ball sealers injected at the next time step and determine the tracking of new and existing ball sealers. The ball sealer skin effect, as calculated in step 416, may be factored into the fluid flow rate, Q, for the next time step. The fluid flow rate may be used to provide a representation of the conditions in the wellbore. The fluid flow rate may be used during the design of a stimulation operation to enable an engineer to adjust the parameters of the stimulation operation to achieve the required results. For example an engineer may adjust the number of ball sealers to inject in a given time step, the pumping schedule, the size of the ball sealers, or any other suitable parameter impacting the stimulation operation. The fluid flow rate may be used real-time during a stimulation operation to represent the conditions in the wellbore. The conditions in the wellbore may enable an operator to monitor and/or adjust the stimulation operation if necessary. For example, the operator may adjust the surface pressure of the fluid.

Figure 5A:
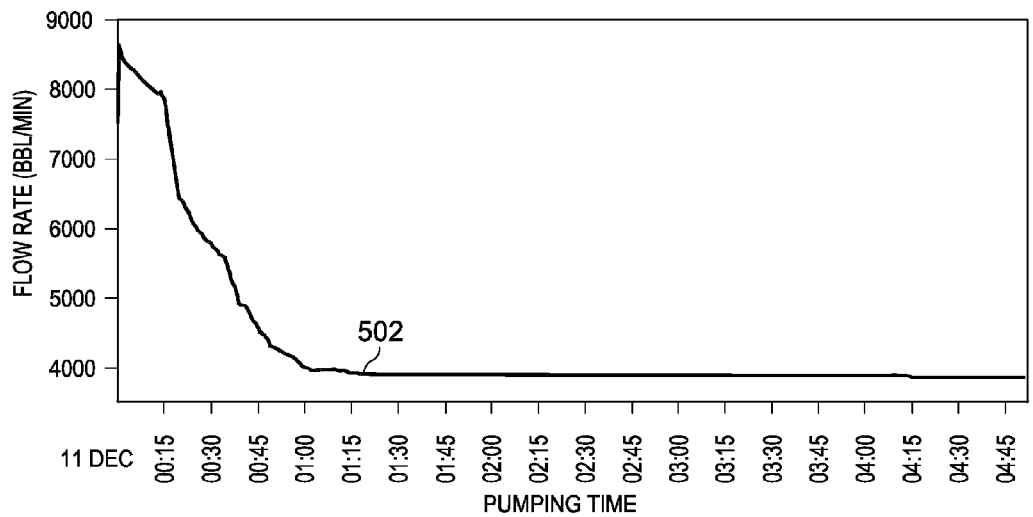
FIGS. 5A and 5B illustrate the results from an exemplary embodiment of the method shown in FIG. 4, in accordance with some embodiments of the present disclosure.
Figure 5B:
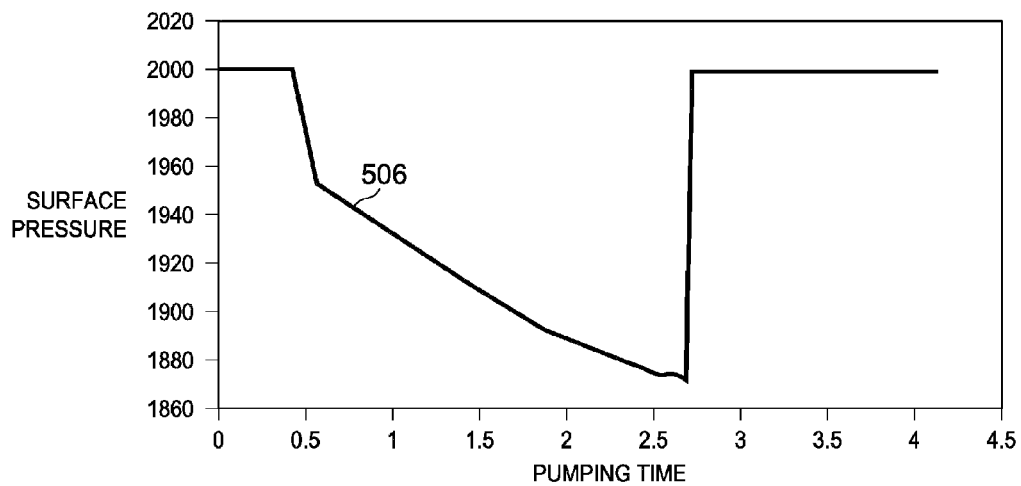

FIGS. 5A and 5B illustrate the results from an exemplary embodiment of method 400 as shown in FIG. 4, in accordance with some embodiments of the present disclosure. A simulation was performed for a Newtonian fluid in a vertical well. In the simulation shown in FIGS. 5A and 5B, the fluid was 15% hydrochloric (HCL) acid. Fourteen-thousand gallons of 15% HCL acid were pumped into the wellbore at a rate of five barrels per minute. A total of 100 ball sealers were injected over the course of pumping the fourteen-thousand gallons of acid.

FIG. 5A illustrates a graph 500 of the flow rate of the 15% HCL acid over time. As the ball sealers seat in perforations, the flow rate, as shown by curve 502, decreases due to the increase in the ball sealer skin effect. FIG. 5B illustrates a graph 504 of the surface pressure of the 15% HCL acid over time. As the ball sealers seat in perforations, the surface pressure, as shown by curve 506, decreases during the period the ball sealers are seating in the perforations. Once all ball sealers are seated, the surface pressure returns to the value before any ball sealers were seated.

Although the present disclosure and its advantages have been described in detail, it should be understood that various changes, substitutions and alterations can be made herein without departing from the spirit and scope of the disclosure as defined by the following claims. For example, while the embodiment discussed describes a calculation for Newtonian, non-compressible flow, the method disclosed may be used for compressible flow and for non-Newtonian fluids.

What is claimed is:

1. A method of computational modeling for tracking ball sealers in a wellbore, the method comprising:
    calculating a number of ball sealers to inject into a wellbore at a time step;
    injecting a plurality of ball sealers into the wellbore at a time step based on the calculated number of ball sealers to inject;
    determining a length of the wellbore occupied by a fluid at the time step;

computing a spacing between each of the plurality of ball sealers in the length of the wellbore occupied by the fluid at the time step;

calculating a first position of at least one of the plurality of ball sealers, the first position defined in reference to a three-axis coordinate system;

determining a velocity of the at least one of the plurality of ball sealers;

computing a second position of the at least one of the plurality of ball sealers based on the first position of the at least one of the plurality of ball sealers and the velocity of the at least one of the plurality of ball sealers, the second position defined in reference to the three-axis coordinate system;

recording a number of active ball sealers and a number of open perforations in the wellbore based on the second position of the at least one of the plurality of ball sealers;

calculating a ball sealer skin per division for the at least one of the plurality of ball sealers based on the number of active ball sealers and the number of open perforations in the wellbore;

determining a fluid flow rate of the fluid based on the ball sealer skin per division for at least one of the plurality of ball sealers; and selecting parameters for a stimulation operation in the wellbore based on the fluid flow rate of the fluid.

2. The method of claim 1, wherein determining a velocity of the at least one of the plurality of ball sealers includes calculating a velocity due to buoyancy based on a type of fluid injected.

3. The method of claim 1, wherein selecting parameters for a stimulation operation in the wellbore includes selecting at least one of the number of ball sealers to inject at the time step, a pumping schedule, or a size of the at least one of the plurality of ball sealers.

4. The method of claim 1, wherein selecting parameters for a stimulation operation in the wellbore is done in real-time during a stimulation operation.

5. The method of claim 1, wherein injecting the plurality of ball sealers further includes uniformly distributing the plurality of ball sealers in the fluid injected at the time step.

6. The method of claim 1, wherein the number of ball sealers injected at the time step is proportional to a volume of the fluid injected at the step time.

7. The method of claim 1, wherein calculating a number of ball sealers to inject into a wellbore further includes:

determining whether a first calculated value of the number of ball sealers to inject at a first time step is an integer; and based on the determination that the first calculated value is not an integer:

selecting the integer portion of the first calculated value as the number of ball sealers to inject into a wellbore at the first time step;

saving the fractional portion of the first calculated value; and during a second calculation of the number of ball sealers to inject into the wellbore at a second time step, adding the fraction portion of the first calculated value to the second calculated value of the number of ball sealers to inject into the wellbore at the second time step.

8. A non-transitory machine-readable medium comprising instructions stored therein, the instructions executable by one or more processors to facilitate performing a method of computational modeling for tracking ball sealers in a wellbore, the method comprising:

calculating a number of ball sealers to inject into a wellbore at a time step;

injecting a plurality of ball sealers into the wellbore at a time step based on the calculated number of ball sealers to inject;

determining a length of the wellbore occupied by a fluid at the time step;

computing a spacing between each of the plurality of ball sealers in the length of the wellbore occupied by the fluid at the time step;

calculating a first position of at least one of the plurality of ball sealers, the first position defined in reference to a three-axis coordinate system;

determining a velocity of the at least one of the plurality of ball sealers;

computing a second position of the at least one of the plurality of ball sealers based on the first position of the at least one of the plurality of ball sealers and the velocity of the at least one of the plurality of ball sealers, the second position defined in reference to the three-axis coordinate system;

recording a number of active ball sealers and a number of open perforations in the wellbore based on the second position of the at least one of the plurality of ball sealers;

calculating a ball sealer skin per division for the at least one of the plurality of ball sealers based on the number of active ball sealers and the number of open perforations in the wellbore;

determining a fluid flow rate of the fluid based on the ball sealer skin per division for at least one of the plurality of ball sealers; and selecting parameters for a stimulation operation in the wellbore based on the fluid flow rate of the fluid.

9. The non-transitory machine-readable medium of claim 8, wherein determining a velocity of the at least one of the plurality of ball sealers includes calculating a velocity due to buoyancy based on a type of fluid injected.

10. The non-transitory machine-readable medium of claim 8, wherein selecting parameters for a stimulation operation in the wellbore includes selecting at least one of the number of ball sealers to inject at the time step, a pumping schedule, or a size of the at least one of the plurality of ball sealers.

11. The non-transitory machine-readable medium of claim 8, wherein selecting parameters for a stimulation operation in the wellbore is done in real-time during a stimulation operation.

12. The non-transitory machine-readable medium of claim 8, wherein injecting the plurality of ball sealers further includes uniformly distributing the plurality of ball sealers in the fluid injected at the time step.

13. The non-transitory machine-readable medium of claim 8, wherein the number of ball sealers injected at the time step is proportional to a volume of the fluid injected at the step time.

14. The non-transitory machine-readable medium of claim 8, wherein calculating a number of ball sealers to inject into a wellbore at a time step further includes:

determining whether a first calculated value of the number of ball sealers to inject at a first time step is an integer; and based on the determination that the first calculated value is not an integer:

selecting the integer portion of the first calculated value as the number of ball sealers to inject into a wellbore at the first time step;

saving the fractional portion of the first calculated value; and during a second calculation of the number of ball sealers to inject into the wellbore at a second time step, adding the fraction portion of the first calculated value to the second calculated value of the number of ball sealers to inject into the wellbore at the second time step.

15. A drilling system, comprising:
a wellbore, including a plurality of perforations;
a fluid inserted into the wellbore;
a plurality of ball sealer in the fluid; and
a modeling system, the modeling system configured to track ball sealers in a wellbore by:
　calculating a number of ball sealers to inject into the wellbore at a time step;
　injecting a plurality of ball sealers into the wellbore at a time step based on the calculated number of ball sealers to inject;
　determining a length of the wellbore occupied by a fluid at the time step;
　computing a spacing between each of the plurality of ball sealers in the length of the wellbore occupied by the fluid at the time step;
　calculating a first position of at least one of the plurality of ball sealers, the first position defined in reference to a three-axis coordinate system;
　determining a velocity of the at least one of the plurality of ball sealers;
　computing a second position of the at least one of the plurality of ball sealers based on the first position of the at least one of the plurality of ball sealers and the velocity of the at least one of the plurality of ball sealers, the second position defined in reference to the three-axis coordinate system;
　recording a number of active ball sealers and a number of open perforations in the wellbore based on the second position of the at least one of the plurality of ball sealers;
　calculating a ball sealer skin per division for the at least one of the plurality of ball sealers based on the number of active ball sealers and the number of open perforations in the wellbore;
　determining a fluid flow rate of the fluid based on the ball sealer skin per division for at least one of the plurality of ball sealers; and
　selecting parameters for a stimulation operation in the wellbore based on the fluid flow rate of the fluid.

16. The drilling system of claim 15, wherein determining a velocity of the at least one of the plurality of ball sealers includes calculating a velocity due to buoyancy based on a type of fluid injected.

17. The drilling system of claim 15, wherein selecting parameters for a stimulation operation in the wellbore includes selecting at least one of the number of ball sealers to inject at the time step, a pumping schedule, or a size of the at least one of the plurality of ball sealers.

18. The drilling system of claim 15, wherein selecting parameters for a stimulation operation in the wellbore is done in real-time during a stimulation operation.

19. The drilling system of claim 15, wherein injecting the plurality of ball sealers further includes uniformly distributing the plurality of ball sealers in the fluid injected at the time step.

20. The drilling system of claim 15, wherein the number of ball sealers injected at the time step is proportional to a volume of the fluid injected at the step time.

* * * * *